(12) United States Patent
Ozeki

(10) Patent No.: US 7,209,377 B2
(45) Date of Patent: Apr. 24, 2007

(54) FERROELECTRIC MEMORY DEVICE, ELECTRONIC DEVICE

(75) Inventor: Hiroyoshi Ozeki, Nagano (JP)

(73) Assignee: Seiko Epson Corporation (JP)

( * ) Notice: Subject to any disclaimer, the term of this patent is extended or adjusted under 35 U.S.C. 154(b) by 115 days.

(21) Appl. No.: 11/174,905

(22) Filed: Jul. 5, 2005

(65) Prior Publication Data
US 2006/0007725 A1   Jan. 12, 2006

(30) Foreign Application Priority Data
Jul. 7, 2004   (JP)   ............................. 2004-200595

(51) Int. Cl.
*G11C 11/22*   (2006.01)
(52) U.S. Cl. ...................... 365/145; 365/149
(58) Field of Classification Search ................. 365/145, 365/149
See application file for complete search history.

(56) References Cited

U.S. PATENT DOCUMENTS 5,455,786 A * 10/1995 Takeuchi et al. ............ 365/145

6,574,135 B1 * 6/2003 Komatsuzaki ............... 365/145

FOREIGN PATENT DOCUMENTS

JP   10-125076   5/1998

* cited by examiner

*Primary Examiner*—Anh Phung
*Assistant Examiner*—Eric J. Wendler
(74) *Attorney, Agent, or Firm*—Harness, Dickey & Pierce, P.L.C.

(57) ABSTRACT

A ferroelectric memory device including a pair of main bit lines (MBLU1, MBLL1) having generally identical line width and line length, a sense amplifier (SA) that lies between one of the main bit lines and the other of the main bit lines, a plurality of local bit lines (LBLU1, etc.) associated with each of the main bit lines, a plurality of switching elements (TrU1, etc.), each provided between each of the local bit lines and the main bit line, a plurality of memory cells (MCU1, etc.), and a plurality of dummy cells (DMC1, etc.) for generating a reference potential, wherein one of the main bit lines is connected to one of the local bit lines to readout data from one of the memory cells connected to the one of the local bit lines, and the dummy cell connected to the other of the main bit lines is selected to generate a reference potential.

6 Claims, 5 Drawing Sheets

FERROELECTRIC MEMORY DEVICE, ELECTRONIC DEVICE

RELATED APPLICATIONS

This application claims priority to Japanese Patent Application No. 2004-200595 filed Jul. 7, 2004 which is hereby expressly incorporated by reference herein in its entirety.

BACKGROUND

1. Technical Field

The present invention relates to ferroelectric memory devices (ferroelectric memories) that use ferroelectric capacitors, and electronic apparatuses equipped with the same, and more particularly, to improvement of the technology for generating reference potentials to be used for data judgment.

2. Related Art

Ferroelectric memory devices (FeRAMs) have a non-volatile property, and are characterized by operation capability equal to that of conventional DRAMs or the like, and therefore have been drawing attention in recent years. When a 1T1C type in which one ferroelectric capacitor and one transistor are combined is used as a memory cell of a ferroelectric memory device, a reference potential is required as a criterion when reading data stored in the memory cell and judging the content of the data ("0" or "1"). As a method to generate the reference potential, a method that uses a constant potential generation circuit, a method that uses a reference cell (dummy cell) and the like are known.

A conventional example of the technology for generating a reference potential by using a dummy cell is described in, for example, Japanese Laid-open Patent Application HEI 10-125076. In the ferroelectric memory described in this document, at the time of readout operation, a dummy capacitor having a predetermined capacitance is connected with a non-inverted bit line to be connected with a selected ferroelectric memory cell, and the value of capacitance thereof is set to be greater than that of an inverted bit line to be connected with a corresponding dummy cell, thereby optimizing the reference potential (voltage level) obtained by the dummy cell.

However, in the conventional technology described above, a dummy capacitor circuit for connecting a dummy capacitor to a non-inverted bit line at a desired timing is required to be added, which is inconvenient because this would likely result in an increase in the device area.

Therefore, it is an object of the present invention to provide a technology for a ferroelectric memory device that generates a reference potential by using a dummy cell, whereby its control at the time of readout can be readily performed, and an increase in the device area can be suppressed.

SUMMARY

A first embodiment of the present invention pertains to a ferroelectric memory device having memory cells using ferroelectric capacitors disposed at intersections of a plurality of word lines and a plurality of bit lines, respectively, and is characterized in comprising: a pair of main bit lines having generally identical line width and line length; a sense amplifier that lies between one of the main bit lines and the other of the main bit lines; a plurality of local bit lines associated with each of the main bit lines and disposed in parallel with the main bit lines; a plurality of switching elements, each provided between each of the local bit lines and the main bit line for selectively connecting one of the plurality of local bit lines to the main bit line; a plurality of memory cells, each provided at an intersection between each of the word lines and each of the plurality of local bit lines; and a plurality of dummy cells, each provided at an intersection between each of the word lines and the main bit line, and used for generating a reference potential, wherein one of the main bit lines is connected to one of the local bit lines through the switching element to readout data from one of the memory cells connected to the one of the local bit lines, and the dummy cell connected to the other of the main bit lines is selected to generate a reference potential.

According to the structure described above, the bit line capacitance on the dummy cell side becomes physically smaller than the bit line capacitance on the memory cell side that is a target for data readout. Accordingly, an appropriate reference potential can be generated even when a dummy cell having a structure equal to a regular memory cell is used, such that an increase in the device area, which may be caused by a circuit region (dummy cell region) to be used for generating a reference potential, can be suppressed. If a structure in which a dummy cell is connected to a bit line is used, the area of a ferroelectric capacitor would need to be enlarged to increase the capacitance of the capacitor so that a charge amount larger than that of a regular memory cell can be retrieved. However, in this case, the process control for forming minute ferroelectric bodies is difficult, and thus differences in their characteristics would likely occur among memory cells, and a desired capacitor capacitance, in other words, a desired reference potential would be difficult to obtain. In contrast, in accordance with the present invention, because regular memory cells and dummy cells can be made in the same structure, such that they would become difficult to be affected by such differences in the manufacturing process as described above, and an accurate reference potential can be generated. Furthermore, because the local bit line system is adopted, the bit line capacitance is smaller than that of a memory cell array that does not use the system, such that a large difference can be given between a readout potential when data "1" is stored and a readout potential when data "0" is stored in a regular memory cell. Accordingly, a ferroelectric memory device that is easy to control at the time of readout can be obtained.

Preferably, the memory cells and the dummy cells may be provided with substantially the same structure. It is noted here that the term "substantially the same structure" means that they can be considered substantially the same in view of their electric characteristics, and includes the cases where they are identical in their circuit structure and/or they are identical in view of their device structure.

By this, the influence by differences in the manufacturing process can be readily avoided, and suitable dummy cells can be obtained.

Preferably, the plurality of local bit lines may have generally the same line width and line length.

By this, the bit line capacitor on the side of a memory cell that is a target for readout, in other words, the sum of capacitances by the main bit line and the local bit line assumes generally the same value no matter which one of the local bit lines is connected, and therefore setting of the reference potential can become much easier.

Preferably, the main bit line and the sense amplifier may be connected in an open bit line system.

By this, the word lines and the plate lines can be shared, such that a 2T2C type, etc. other than a 1T1C type can be readily adopted as a memory cell structure, and the device structure can be readily simplified. Also, for example, in the case of a return bit line system, signal wirings such as word lines and plate lines must be separately provided, such that switching elements (memory cells) that are connected to bit lines need to be diagonally disposed, which makes the layout complicated and causes disadvantages in terms of the area. Such disadvantages can be avoided.

A second embodiment of the present invention pertains to an electronic apparatus equipped with the ferroelectric memory device described above. It is noted here that the "electronic apparatus" refers to apparatuses in general which perform specified functions, and is not particularly limited to any structure, but can include any apparatuses in which storage devices (memories) are incorporated, such as, computer devices in general that are equipped with the storage devices described above, portable telephones, PHSs, PDAs (portable information terminals), electronic notebooks, IC cards, and the like.

DETAILED DESCRIPTION

An embodiment of the present invention is described below with reference to the accompanying drawings.

Figure 1:
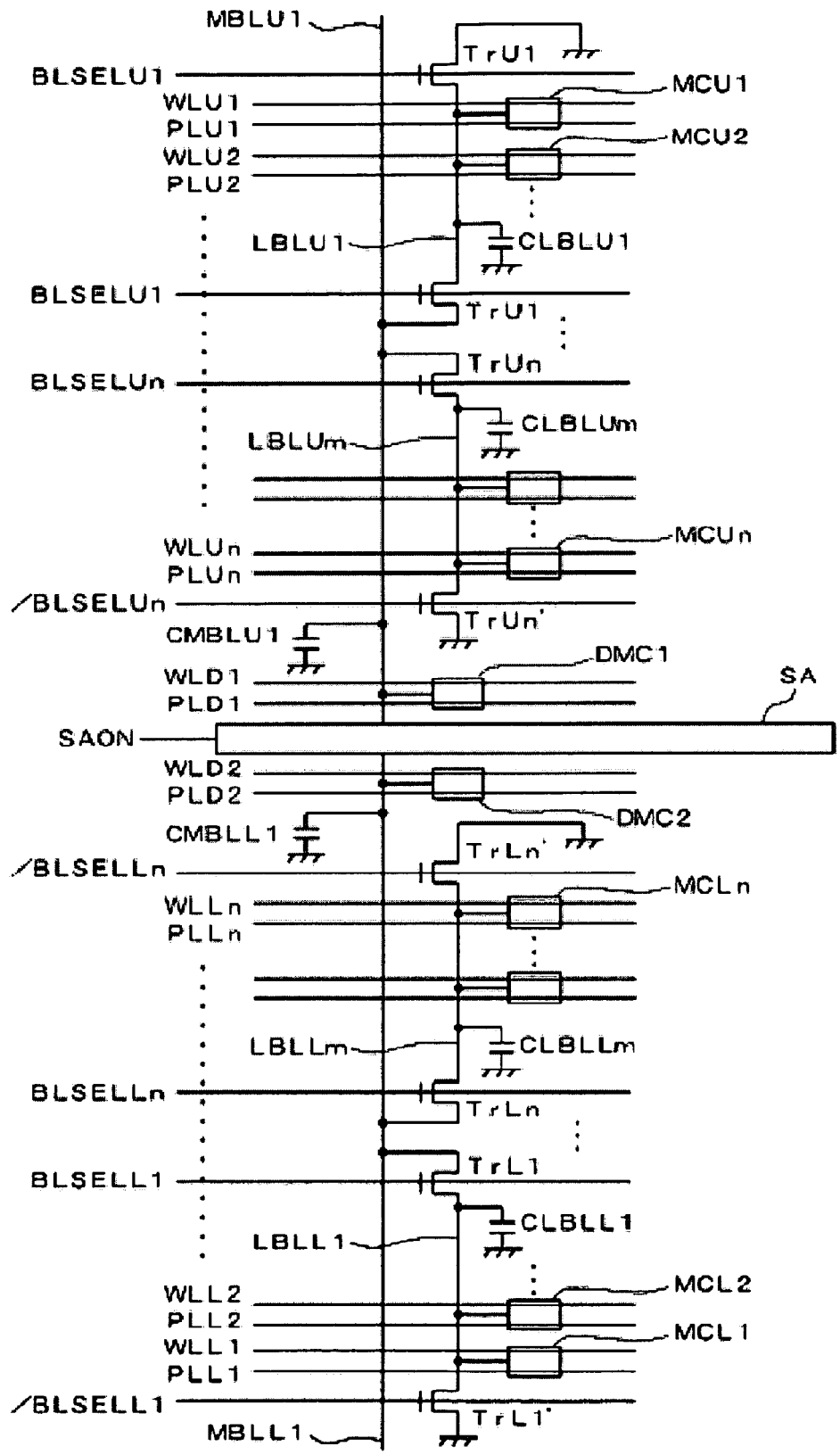
FIG. 1 is a circuit diagram showing an example of a ferroelectric memory device in accordance with the present invention.

FIG. 1 is a circuit diagram showing an example of a ferroelectric memory device in accordance with the present invention. The ferroelectric memory device of the present embodiment pertains to a ferroelectric memory device having memory cells that use ferroelectric capacitors at intersections of a plurality of word lines and a plurality of bit lines, respectively, and FIG. 1 shows a main structure of the memory cell array for one of its columns.

A pair of main bit lines MBLU1 and MBLL1 have generally the same line width and line length, and are disposed orthogonal to each word line WLU1, WLU2, ..., WLUn, WLL1, WLL2, ..., WLLn, and each plate line PLU1, PLU2, ..., PLUn, PLL1, PLL2, ..., PLLn.

A sense amplifier SA is provided between one of the main bit lines MBLU1 and the other of the main bit lines MBLL1. In the present embodiment shown in the diagram, an open bit line system is used as a connection mode for each of the main bit lines and the sense amplifier.

Each of the main bit lines MBLU1 and MBLL1 is associated with a plurality of local bit lines, and the local bit lines are disposed in parallel with each of the main bit lines. In other words, the present embodiment adopts a hierarchical bit line structure. Concretely, the main bit line MBLU1 is associated with m number of local bit lines LBLU1, ..., LBLUm, and the main bit line MBLL1 is associated with m number of local bit lines LBLL1, ..., LBLLm. Those local bit lines LBLU1, ..., LBLUm, and LBLL1, ..., LBLLm are formed with generally the same line width and line length.

Each switching element TrU1, ..., TrUn, TrL1, ..., TrLn is provided for selectively connecting (electrically connecting) one (one line) of the plurality of local bit lines to either the main bit line MBLU1 or MBLL1, and is provided between the corresponding one of the local bit lines and either the main bit line MBLU1 or MBLL1. As the switching element, any type can be used as long as it achieves the function of electrically connecting or insulating the main bit line and the local bit line, and for example, a transistor may preferably be used. In the present embodiment, a NMOS transistor is used as each of the switching elements. By giving a predetermined control signal to each control line BLSELU1, ..., BLSELUn, BLSELL1, ..., LBSELLn, the operation of each of the corresponding switching elements TrU1, etc. is controlled.

Figure 2:
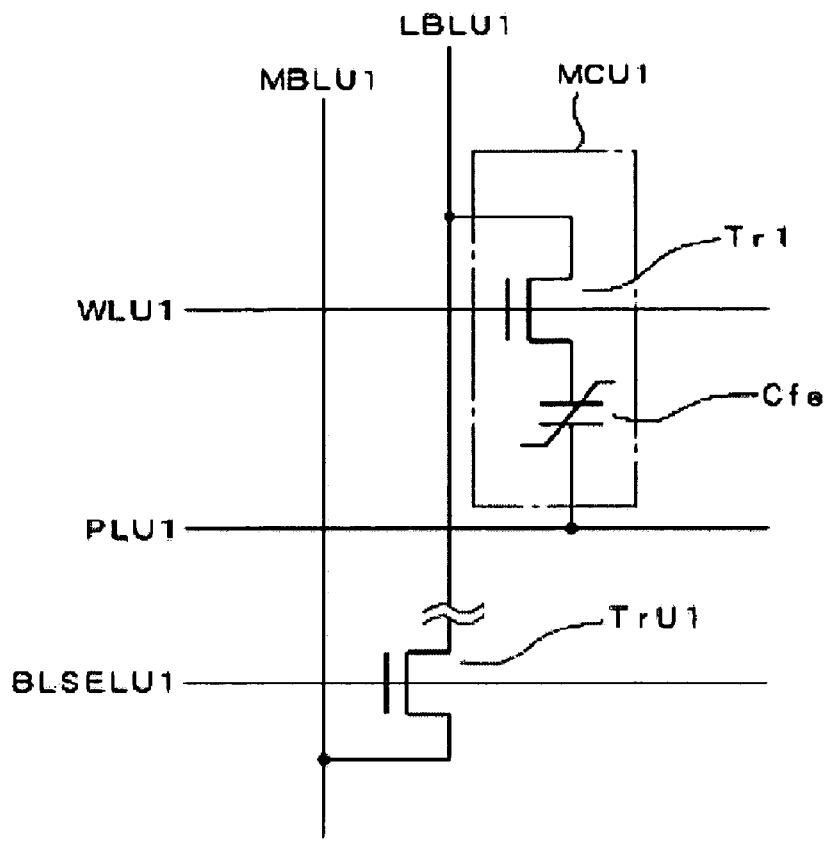
FIGS. 2 (A) and 2 (B) show diagrams for describing the structures of a memory cell and a dummy cell in detail.
Figure 2:
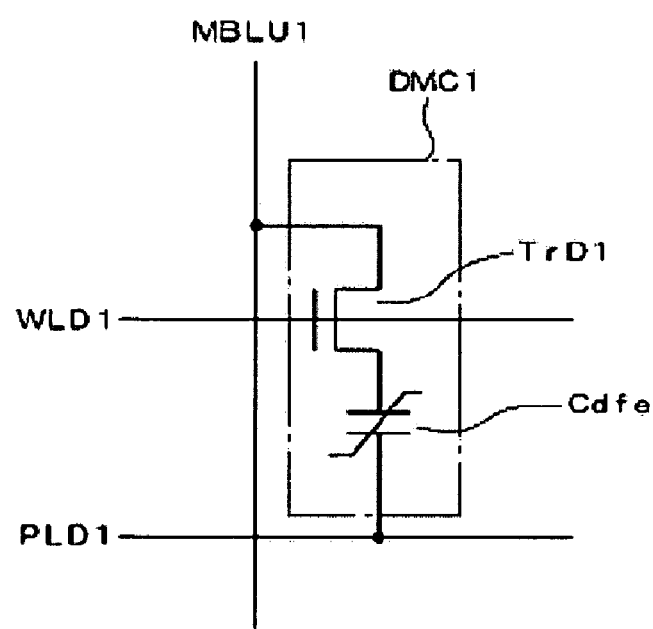

Each memory cell MCU1, MCU2, ..., MCUn, MCL1, MCL2, ..., MCLn is provided at an intersection of each of the corresponding word lines WLU1, etc. and each of the corresponding local bit lines LBLU1, etc. As each of the memory cells MCU1, etc., a 1T1C type that is composed of a combination of one transistor Tr1 and one ferroelectric capacitor Cfe shown in FIG. 2(A) is adopted.

Each dummy cell DMC1, DMC2 is used for generating a reference potential Vref, and is provided at an intersection of each corresponding dummy word line WLD1, WLD2 and each corresponding dummy plate line PLD1, PLD2 and one of the main bit lines MBLU1 and MBLL1, respectively. As each of the dummy cells DMC1, DMC2, a 1T1C type that is composed of a combination of one transistor TrD1 and one ferroelectric capacitor Cdfe shown in FIG. 2(B) is adopted. In this manner, in the present example, each of the memory cells MCU1, etc. and each of the dummy cells DMC1, etc. have substantially the same structure. It is noted here that the term "substantially the same structure" means that they can be considered substantially the same in view of their electric characteristics, and includes the cases where they are identical in their circuit structure and/or they are identical in view of their device structure.

Each switching element TrU1', ..., TrUn', TrL1', ..., TrLn' is provided for selectively connecting each of the local bit lines LBLU1, etc. to a ground potential (for discharging to GND), and is provided between each of the corresponding local bit lines LBLU1, etc. to the ground potential. As each of the switching elements, any type can be used as long as it achieves the function of connecting or insulating the local bit line and the ground potential, and for example, a transistor may preferably be used. In the present embodiment, a NMOS transistor is used as each of the switching elements. By giving a predetermined control signal to each control line /BLSELU1, ..., /BLSELUn, /BLSELL1, ..., /LBSELLn, the operation of each of the corresponding switching elements TrU1', etc. is controlled. An inversion signal of the control signal that is inputted in each control line BLSELU1, ..., BLSELUn, BLSELL1, ..., LBSELLn is inputted in each control line /BLSELU1, ..., /BLSELUn, /BLSELL1, ..., /LBSELLn, respectively.

The ferroelectric memory device in accordance with the present embodiment has the structure described above. Next, operations thereof at the time of data reading are described in detail below.

First, bit line capacitances that are generated by each of the main bit lines and the respective local bit lines at the time of operations of the ferroelectric memory device in accordance with the present embodiment are described (see FIG. 1).

As described above, the local bit lines LBLU1, ..., LBLUm, and the local bit lines LBLL1, ..., LBLLm are formed with generally the same line width and line length. Accordingly, bit line capacitances CLBLU1, ..., CLBLUm, CLBLL1, ..., CLBLLm, which are generated by the respective local bit lines LBLU1, etc., have similar values. This relation is expressed by Formula (1) as follows:

$$CLBLU1=CLBLU2=\ldots=CLBLUm=CLBLL1=CLBLL2=\ldots=CLBLLm \quad (1)$$

Also, the main bit lines MBLU1 and MBLL1 are formed with generally the same line width and line length, as described above, such that bit line capacitances CMBLU1 and CMBLL1, which are generated by the respective main bit lines MBLU1, etc., have similar values. This relation is expressed by Formula (2) as follows:

$$CMBLU1=CMBLL1 \quad (2)$$

Next, while considering the relations indicated by Formula (1) and Formula (2) described above, operations at the time of data readout are described. As an example, descriptions are made as to a case where the memory cell MCU1 on the upper side of the sense amplifier SA is a target for data readout, and the dummy cell DMC2 on the lower side of the sense amplifier SA is used for generation of a reference potential Vref.

Figure 3:
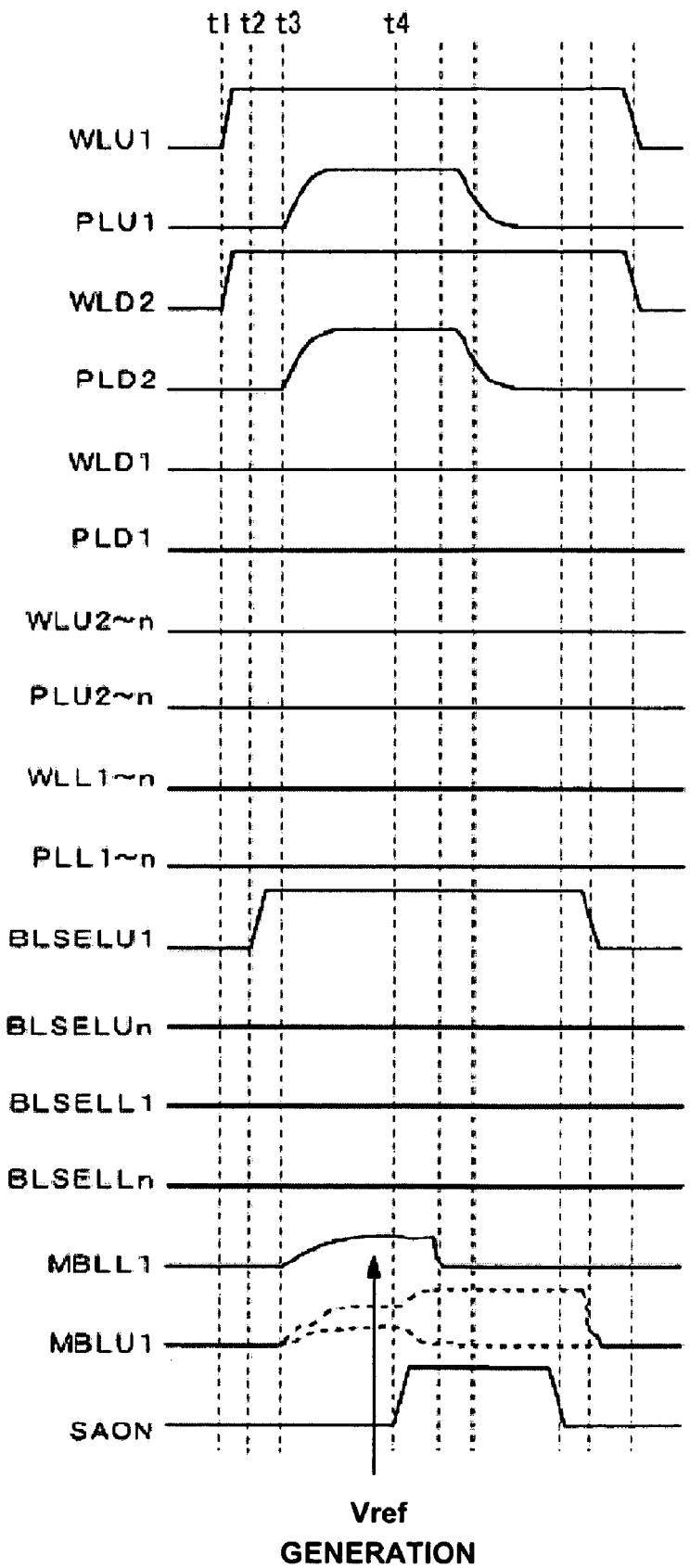
FIG. 3 is a chart for describing signal waveforms at the time of data readout.

FIG. 3 is a chart for describing waveforms of input signals or output signals on the respective control lines (word lines, bit lines, etc.) at the time of data readout.

At time t1, a potential at H level (for example, a power supply potential VDD) is given to the word line WLU1 and the dummy word line WLD2. By this, the memory cell MCU1 is connected to the local bit line LBLU1, and the dummy cell DMC2 is connected to the main bit line MBLL1. It is noted that a potential at L level (for example, 0V) is given to the other word lines WLU2–WLUn, WLL1–WLLn, and the dummy word line WLD1, and the other plate lines PLU2–PLUn, PLL1–PLLn, and the dummy plate line PLD1.

At time t2, a potential at H level is given to the control line BLSELU1. By this, the switching element TrU1 becomes conductive, such that the local bit line LBLU1 is connected to the main bit line MBLU1 through the switching element TrU1. Also, at this moment, a potential at L level is given to the other control lines BLSELU2–BLSELUn, BLSELL1–BLSELLn. By this, the other local bit lines, excluding the local bit line LBLU1, are placed in a state insulated (cut off) from the main bit line MBLU1 or MBLL1. Also, an inversion signal of the signal that is inputted in each control line /BLSELU1, ..., /BLSELUn, /BLSELL1, ..., /LBSELLn is inputted in each control line BLSELU1, etc. ..., respectively, in a manner described above. By this, the switching element TrU1' is placed in a cut off state, and the local bit line LBLUL1 is placed in a state that is not connected to the ground potential. Also, each of the other switching elements TrU2–TrUn, and TrL1–TrLn is placed in a conductive state, and each of the other local bit lines, excluding the local bit line LBLU1, is connected to the ground potential.

At time t3, a potential at H level is given to each of the plate line PLU1 and the dumpy plate line PLD2. By this, a potential, that is determined by the direction of polarization written in the ferroelectric capacitor Cfe of the memory cell MCU1 and a bit line capacitance generated by the entirety of the local bit line LBLU1 and the main bit line MBLU1, is induced on the main bit line MBLU1. Similarly, a potential, that is determined by the direction of polarization written in the ferroelectric capacitor Cdfe of the dummy memory cell DMC2 and a bit line capacitance generated by the entirety of the main bit line MBLL1, is induced on the main bit line MBLL1.

It is noted here that a capacitance CMC1 that appears when the memory cell MCU1 is read is the sum of the bit line capacitances generated by the main bit line MBLU1 and the local bit line LBLU1, and is expressed by Formula (3) as follows:

$$CMC1=CLBLU1+CMBLU1 \quad (3)$$

On the other hand, a capacitance CDMC2 that appears when generating a reference potential by using the dummy cell DMC2 is a bit line capacitance, and is expressed by Formula (4) as follows:

$$CDMC2=CMBLL1 \quad (4)$$

The following relation can be derived from Formula (3) and Formula (4) described above:

$$CDMC2=CMC1-CLBLU1 \quad (5)$$

Based of the relations described above, bit line potentials generated on the respective main bit lines MBLU1 and MBLL1 are described.

Figure 4:
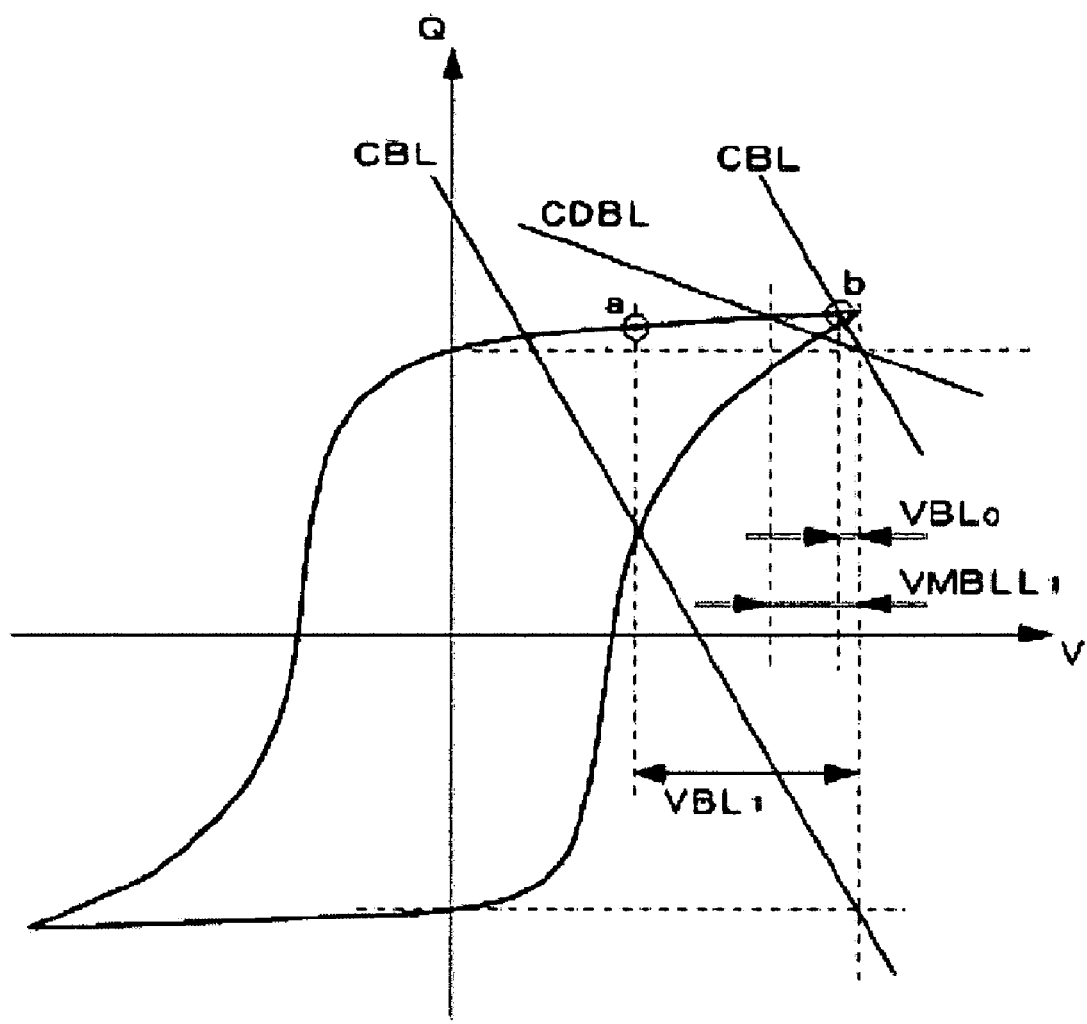
FIG. 4 is a graph for describing the principle of the data readout operation in greater detail.

FIG. 4 is a figure (graph) for describing the principle of data readout operation in greater detail. In the graph, the axis of abscissas corresponds to voltages V impressed to a ferroelectric capacitor, and the axis of ordinates corresponds to charges Q accumulated in the ferroelectric capacitor. The ferroelectric capacitors Cfe and Cdfe included in the memory cells and dummy cells, respectively, each have hysteresis characteristics indicated by curves in FIG. 4.

A potential $VBL_1$ that is read out when data "1" is stored in the memory cell MCU1, and a potential $VBL_0$ that is read out when data "0" is stored therein are shown in the graph. It is noted here that a potential that is valid as a reference potential Vref needs to fulfill the following relation:

$$VBL_0 < Vref < VBL_1 \quad (6)$$

As for the potential $VMBLL_1$ generated on the main bit line MBLL1, because the value of the capacitance CDMC2 is less than the value of the capacitance CMC1 by CLBLU1, as understood from Formula (5) indicated above, the slope of its characteristic linear line becomes gentler by that amount as shown in the graph. The gentler the characteristic linear line, the greater the values of $VBL_1$, $VBL_0$ and $VMBLL_1$ become. Accordingly, to satisfy Formula (6) described above, data "0" may only have to be stored in the dummy cell DMC2. The characteristic linear line for CDMC2 may only have to be a linear line that passes between point a and point b (excluding point a and point b) on the hysteresis curve as shown in the graph. Under this condition, the reference potential Vref is generated on the other main bit line MBLL1. Then, at time t4, a predetermined control signal is inputted to the control line SAON to thereby operate the sense amplifier SA (see FIG. 3), whereby the reference potential Vref and a potential generated on one of the main bit lines MBLU1 are detected, such that the content of data stored in the memory cell MCU1 can be judged.

Figure 5:
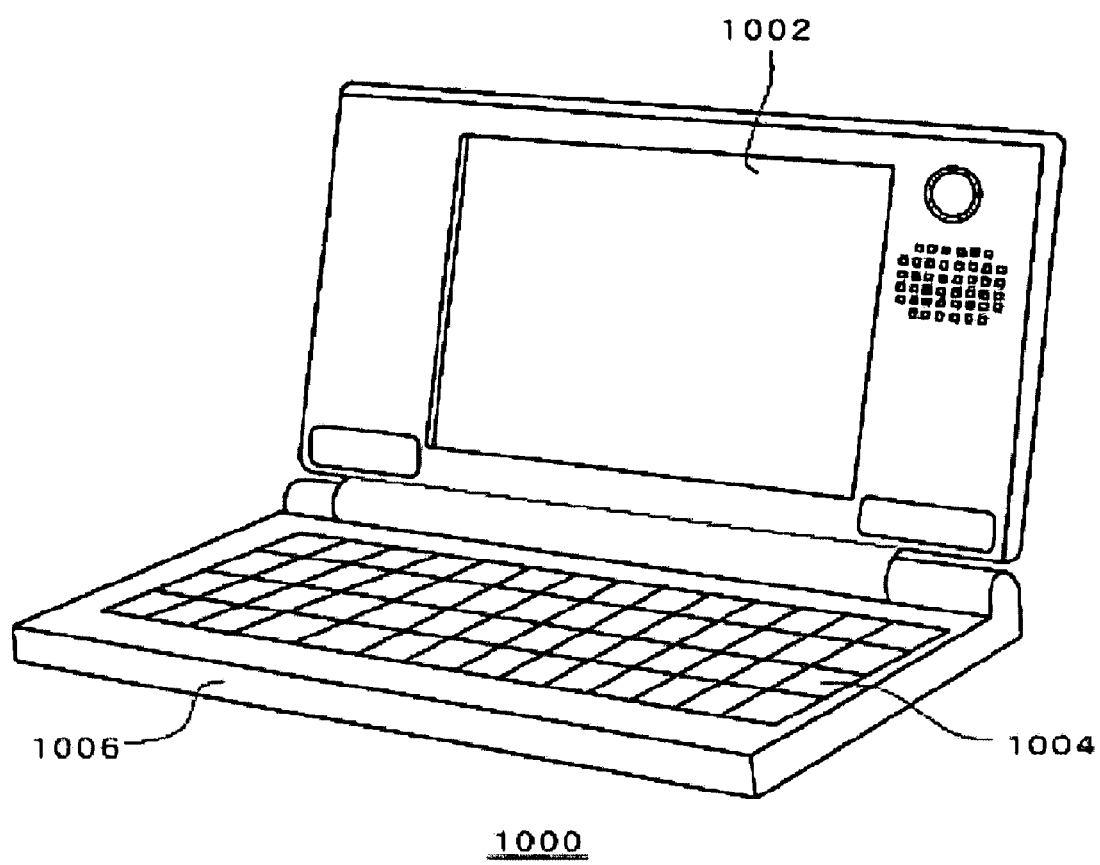
FIG. 5 is a perspective view showing an example of an electronic apparatus equipped with a ferroelectric memory device.

FIG. 5 is a perspective view showing a structure of a personal computer 1000, which is an example of an electronic apparatus equipped with a ferroelectric memory device in accordance with the present embodiment. Referring to FIG. 5, the personal computer 1000 has a structure equipped with a display panel 1002 and a main body 1006 having a keyboard 1004. As storage medium, and in particular, as a nonvolatile memory of the main body 1006 of the personal computer 1000, a ferroelectric memory device in accordance with the present embodiment is used.

In this manner, in the ferroelectric memory device in accordance with the present embodiment, the bit line capacitance on the dummy cell side (the capacitance only by the main bit line) becomes physically smaller than the bit line capacitance on the memory cell MC side that is a target for data readout (the sum of the capacitance by the main bit line and the capacitance by the local bit line). Accordingly, a reference potential can be generated by using a dummy cell that has the same structure as that of a regular memory cell, an increase in the device area, which may be caused by a region (dummy cell region) for generating a reference potential, can be suppressed to a small level.

Also, the regular memory cells MCU1, etc. and the dummy cells DMC1, etc. can be formed in the same structure, such that they become difficult to be affected by differences in the manufacturing process, and an accurate reference potential can be generated.

Furthermore, because the local bit line system is used, the bit line capacitance is smaller than that of a memory cell array that does not use the system, such that a large difference can be given between a readout potential when data "1" is stored and a readout potential when data "0" is stored in a regular cell. Accordingly, a ferroelectric memory device that is easy to control at the time of readout can be obtained.

It is noted that the present invention is not limited to the details of the embodiments described above, and a variety of changes can be made with the scope of the subject matter of the present invention. For example, in the embodiment described above, the case where the main bit lines and the sense amplifier are connected in an open bit line system. However, the present invention is also applicable to systems other than the above, for example, to a return bit line system and a word line shared system.

What is claimed is:

1. A ferroelectric memory device having memory cells using ferroelectric capacitors disposed at intersections of a plurality of word lines and a plurality of bit lines, respectively, the ferroelectric memory device comprising:
   a pair of main bit lines having generally identical line width and line length;
   a sense amplifier that lies between one of the main bit lines and the other of the main bit lines;
   a plurality of local bit lines associated with each of the main bit lines and disposed in parallel with the main bit lines;
   a plurality of switching elements, each provided between each of the local bit lines and the main bit line for selectively connecting one of the plurality of local bit lines to the main bit line;
   a plurality of memory cells, each provided at an intersection between each of the word lines and each of the plurality of local bit lines; and
   a plurality of dummy cells, each provided at an intersection between each of the word lines and the main bit line, and used for generating a reference potential,
   wherein one of the main bit lines is connected to one of the local bit lines through the switching element to readout data from one of the memory cells connected to the one of the local bit lines, and the dummy cell connected to the other of the main bit lines is selected to generate a reference potential.

2. A ferroelectric memory device according to claim 1, wherein the memory cells and the dummy cells have substantially an identical structure.

3. A ferroelectric memory device according to claim 1, wherein the plurality of local bit lines have generally identical line width and line length.

4. A ferroelectric memory device according to claim 1, wherein the main bit line and the sense amplifier are connected in an open bit line system.

5. An electronic apparatus equipped with the ferroelectric memory device according to claim 1.

6. A ferroelectric memory device having memory cells using ferroelectric capacitors disposed at intersections of a plurality of word lines and a plurality of bit lines, respectively, the ferroelectric memory device comprising:
   a pair of main bit lines having generally identical line width and line length;
   a sense amplifier that lies between one of the main bit lines and the other of the main bit lines;
   a plurality of local bit lines associated with each of the main bit lines and disposed in parallel with the main bit lines;
   a plurality of switching elements, each provided between each of the local bit lines and the main bit line for selectively connecting one of the plurality of local bit lines to the main bit line;
   a plurality of memory cells, each provided at an intersection between each of the word lines and each of the plurality of local bit lines; and
   a plurality of dummy cells, each provided at an intersection between each of the word lines and the main bit line, and used for generating a reference potential.

* * * * *